United States Patent
Uemura et al.

(10) Patent No.: US 12,119,792 B2
(45) Date of Patent: Oct. 15, 2024

(54) VARIABLE GAIN AMPLIFIER CIRCUIT AND SEMICONDUCTOR INTEGRATED CIRCUIT

(71) Applicant: SUMITOMO ELECTRIC INDUSTRIES, LTD., Osaka (JP)

(72) Inventors: Hiroshi Uemura, Osaka (JP); Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 415 days.

(21) Appl. No.: 17/522,525

(22) Filed: Nov. 9, 2021

(65) Prior Publication Data

US 2022/0149790 A1    May 12, 2022

(30) Foreign Application Priority Data

Nov. 11, 2020 (JP) ................................ 2020-188073

(51) Int. Cl.
| | |
|---|---|
| H03F 3/45 | (2006.01) |
| H03F 1/32 | (2006.01) |
| H03F 3/193 | (2006.01) |
| H03F 3/72 | (2006.01) |
| H03G 1/00 | (2006.01) |

(52) U.S. Cl.
CPC .......... *H03F 1/3211* (2013.01); *H03F 3/193* (2013.01); *H03F 3/72* (2013.01); *H03G 1/0023* (2013.01)

(58) Field of Classification Search
CPC .......... H03F 1/3211; H03F 3/193; H03F 3/72; H03F 2200/451; H03F 2203/45458; H03F 2203/45492; H03F 3/19; H03F 3/45201; H03F 3/45; H03F 3/45183; H03G 1/0023; H03G 1/0088; H03G 3/45098
USPC ....................................................... 330/254
See application file for complete search history.

(56) References Cited

U.S. PATENT DOCUMENTS

| | | | |
|---|---|---|---|
| 10,992,277 B1* | 4/2021 | Sun ........................... H03F 3/19 |
| 11,228,293 B2* | 1/2022 | Sugimoto ............... H03F 1/302 |

(Continued)

FOREIGN PATENT DOCUMENTS

| | | |
|---|---|---|
| JP | H8-256039 | 10/1996 |
| JP | H11-168334 | 6/1999 |

(Continued)

*Primary Examiner* — Khanh V Nguyen
(74) *Attorney, Agent, or Firm* — Smith, Gambrell & Russell, LLP

(57) ABSTRACT

A variable gain amplifier circuit includes first and second input terminals, first and second output terminals, first and second transistors respectively having bases electrically connected to the first and second input terminals and having collectors electrically connected to the first and second output terminals, and a degeneration circuit connected between emitters of the first and second transistors. The degeneration circuit has first and second MOS transistors each having two current terminals connected in series between the emitters of the first and second transistors, series resistor circuits, first and second current sources, two resistive elements connected between the first and second current sources and gates of the first and second MOS transistors, and two resistive elements connected between the first and second current sources and two nodes of the series resistor circuits.

12 Claims, 13 Drawing Sheets

(56) References Cited

U.S. PATENT DOCUMENTS

2004/0183599 A1    9/2004   Banba
2019/0052236 A1    2/2019   Sugimoto

FOREIGN PATENT DOCUMENTS

JP      2004-304775    10/2004
JP      2019-036817     3/2019

\* cited by examiner

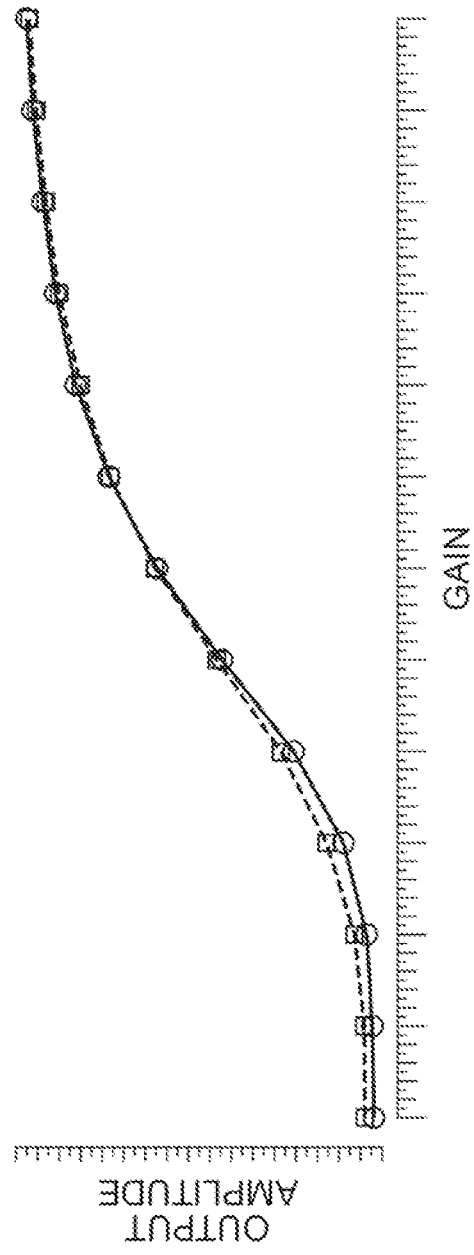
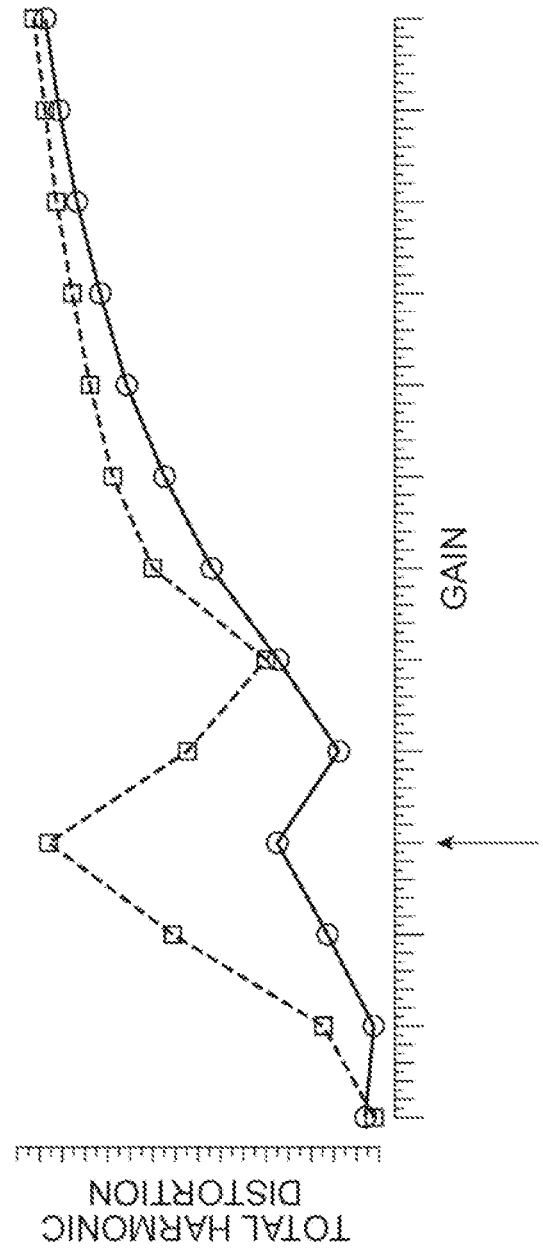
Fig. 6A
Fig. 6B

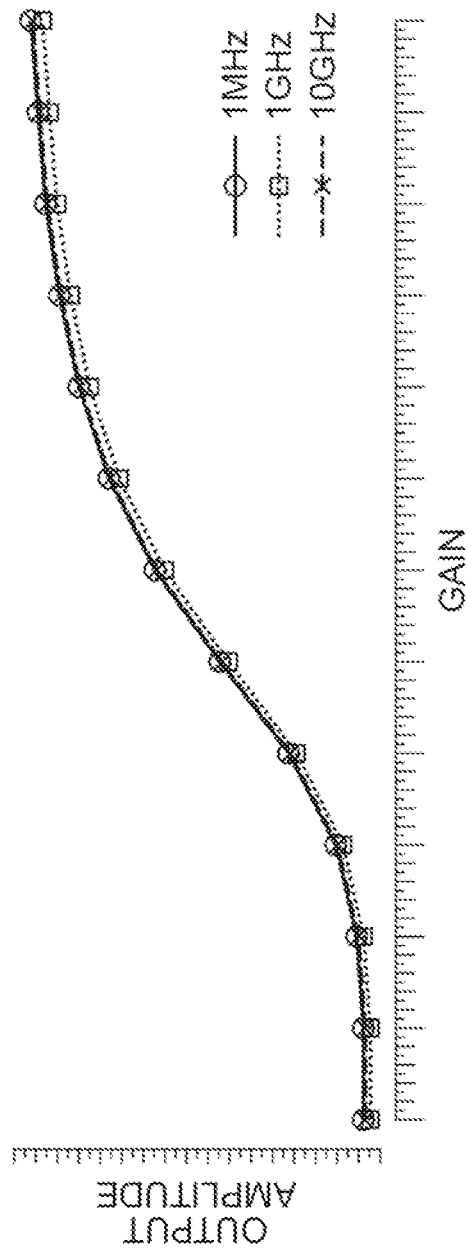
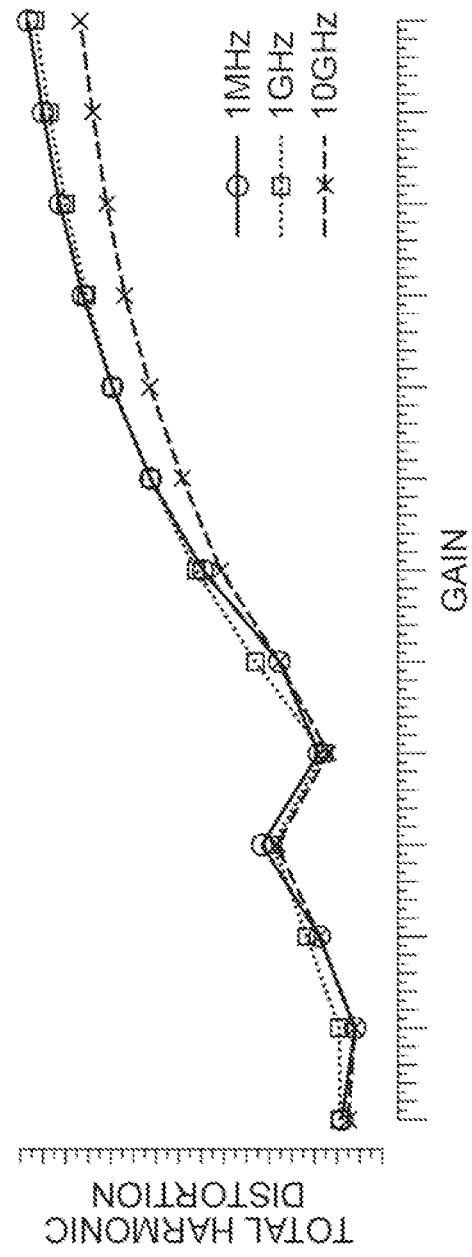
Fig. 8A
Fig. 8B

VARIABLE GAIN AMPLIFIER CIRCUIT AND SEMICONDUCTOR INTEGRATED CIRCUIT

TECHNICAL FIELD

The present disclosure relates to a variable gain amplifier circuit and a semiconductor integrated circuit.

CROSS-REFERENCE TO RELATED APPLICATION

This application claims priority from Japanese Patent Application No. 2020-188073, filed on Nov. 11, 2020, the entire subject matter of which is incorporated herein by reference.

BACKGROUND

An amplifier circuit amplifying and outputting an input differential voltage signal is used as a circuit built into an optical transmitter module or the like. For example, Japanese Unexamined Patent Publication No. H8-256039 discloses an amplifier circuit including a pair of amplification transistors and a gain control transistor connected between sources of the pair of amplification transistors. Due to such a constitution, a gain of the amplifier circuit can be variably controlled.

In the amplifier circuit described above, gain control is realized using a control voltage applied to a gate of the gain control transistor. For this reason, it may be difficult to maintain linearity of an output signal in a broad frequency band. Hence, it is desired to have a variable gain amplifier circuit in which linearity of an output signal in a broad frequency band can be improved.

SUMMARY

A variable gain amplifier circuit according to an aspect of the present disclosure includes a first input terminal and a second input terminal; a first output terminal and a second output terminal; a first transistor having a control terminal, a first current terminal, and a second current terminal, the control terminal being electrically connected to the first input terminal, the first current terminal being electrically connected to the first output terminal; a second transistor having a control terminal, a first current terminal, and a second current terminal, the control terminal of the second transistor being electrically connected to the second input terminal, the first current terminal of the second transistor being electrically connected to the second output terminal; a current source electrically connected between a first power line and the respective second current terminals of the first transistor and the second transistor; a first load element electrically connected between the first output terminal and a second power line; a second load element electrically connected between the second output terminal and the second power line; and a variable resistance circuit having a first node and a second node, the first node being connected to the second current terminal of the first transistor, the second node being connected to the second current terminal of the second transistor, the variable resistance circuit being configured to vary a resistance value between the first node and the second node. The variable resistance circuit includes a first field effect transistor having a first control terminal, a first terminal, and a second terminal, the first terminal being connected to the first node, a second field effect transistor having a second control terminal, a third terminal, and a fourth terminal, the third terminal being connected to the second node, the fourth terminal being connected to the second field effect transistor, a first dividing resistor connected between the first node and a first dividing node, a second dividing resistor connected between the first dividing node and a second dividing node, a third dividing resistor connected between the second dividing node and the second node, a first series resistor, a second series resistor, a first variable current source connected to the first control terminal of the first field effect transistor via the first series resistor, a second variable current source connected to the second control terminal of the second field effect transistor via the second series resistor, a first bias resistor connected between the first variable current source and the first dividing node, and a second bias resistor connected between the second variable current source and the second dividing node.

Alternatively, a variable gain amplifier circuit according to another aspect of the present disclosure includes a first input terminal and a second input terminal; a first output terminal and a second output terminal; a first transistor having a control terminal, a first current terminal, and a second current terminal, the control terminal being electrically connected to the first input terminal, the first current terminal being electrically connected to the first output terminal; a second transistor having a control terminal, a first current terminal, and a second current terminal, the control terminal of the second transistor being c electrically connected to the second input terminal, the first current terminal of the second transistor being electrically connected to the second output terminal; a current source electrically connected between a first power line and the respective second current terminals of the first transistor and the second transistor; a first load element electrically connected between the first output terminal and a second power line; a second load element electrically connected between the second output terminal and the second power line; and a variable resistance circuit having a first node and a second node, the first node being connected to the second current terminal of the first transistor, the second node being connected to the second current terminal of the second transistor, the variable resistance circuit being configured to vary a resistance value between the first node and the second node. The variable resistance circuit includes N (N is an integer of 3 or larger) field effect transistors including a first field effect transistor to an Nth field effect transistor each having two terminals and a control terminal and having the two terminals connected in series between the first node and the second node, the first field effect transistor being connected to the first node, the ith (i is an integer of 2 to N−1) field effect transistor being connected to the i−1th field effect transistor, the Nth field effect transistor being connected between the N−1th field effect transistor and the second node, N+1 dividing resistors including a first dividing resistor to an N+1th dividing resistor connected in series between the first node and the second node, the first dividing resistor being connected between the first node and a first dividing node, the jth (j is an integer of 2 to N) dividing resistor being connected between a j−1th dividing node and a jth dividing node, the N+1th dividing resistor being connected between an Nth dividing node and the second node, N variable current sources including a first variable current source to an Nth variable current source each providing a variable current, N series resistors including a first series resistor to an Nth series resistor, the kth (k is an integer of 1 to N) series resistor being connected between the kth variable current source and the control terminal of the kth field effect transistor, and N bias resistors including a first bias resistor to an Nth bias resistor, the mth (m is an integer of 1 to N) bias resistor being connected between an mth dividing node and the mth variable current source.

BRIEF DESCRIPTION OF THE DRAWINGS

FIG. 6A is a graph showing variation in output amplitude when a gain of the variable gain amplifier circuit 100 according to the embodiment is varied.

FIG. 6B is a graph showing variation in total harmonic distortion of an output voltage signal when a gain of the variable gain amplifier circuit 100 according to the embodiment is varied.

FIG. 8A is a graph showing variation in output amplitude with respect to a gain of the variable gain amplifier circuit 100 according to the embodiment.

FIG. 8B is a graph showing variation in total harmonic distortion with respect to a gain of the variable gain amplifier circuit 100 according to the embodiment.

DETAILED DESCRIPTION

Hereinafter, an embodiment of the present disclosure will be described with reference to the drawings. In description of the drawings, the same reference signs are applied to the same elements, and duplicate description thereof will be omitted.

Figure 1:
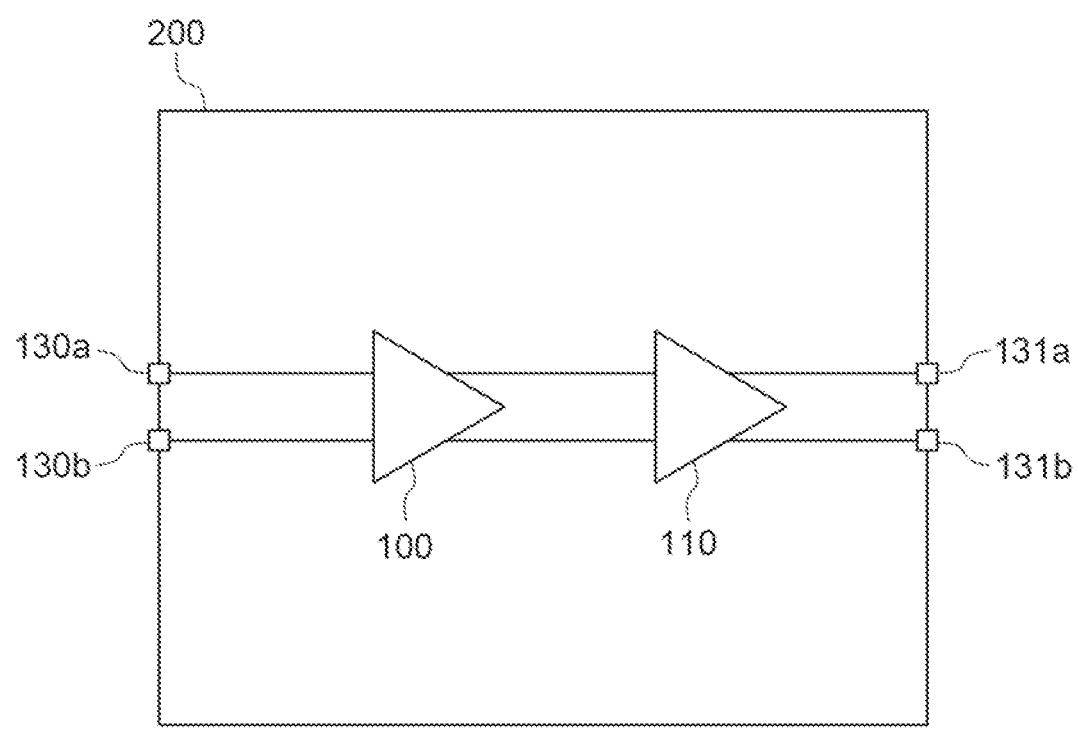
FIG. 1 is a block diagram illustrating a schematic constitution of a drive circuit 200 according to an embodiment.

FIG. 1 is a block diagram illustrating a constitution of a drive circuit 200 according to the embodiment. The drive circuit 200 is a semiconductor integrated circuit (IC), which is built into an optical communication device such as an optical transmitter module, is manufactured through a process of a semiconductor such as a SiGe bipolar complementary metal oxide semiconductor (BiCMOS), for example, and has a size of 2 mm×4 mm, and which amplifies and outputs an input voltage signal. The drive circuit 200 has a pair of input terminals 130a and 130b, a pair of output terminals 131a and 131b, a variable gain amplifier circuit 100, and an output circuit 110.

For example, the input terminals 130a and 130b receive a differential signal constituted of two voltage signals having the same amplitudes and inverted phases each other. The variable gain amplifier circuit 100 amplifies an input differential signal and outputs it to the output circuit 110. The output circuit 110 is a differential amplifier circuit which further amplifies a differential signal output from the variable gain amplifier circuit 100 and outputs it to the outside of the drive circuit 200. The output circuit 110 is constituted through cascade connection to the variable gain amplifier circuit 100.

In the drive circuit 200, the circuit constitution thereof may be suitably changed, the output circuit 110 may be omitted therefrom, and various other circuits may be added thereto. For example, an amplifier for amplifying a signal may be inserted into an input side or an output side of the variable gain amplifier circuit 100. An automatic gain control circuit for controlling a gain of the variable gain amplifier circuit 100 may be mounted. In addition, the circuit constitution is not limited to a constitution having one signal transmission path (channel), and a constitution having a plurality of channels (for example, four channels) arranged in parallel may be adopted.

Next, with reference to FIG. 2, a constitution of the variable gain amplifier circuit 100 according to the present embodiment will be described. In the following description, the reference voltage is referred to as a ground potential (0 V) unless otherwise specified.

Figure 2:
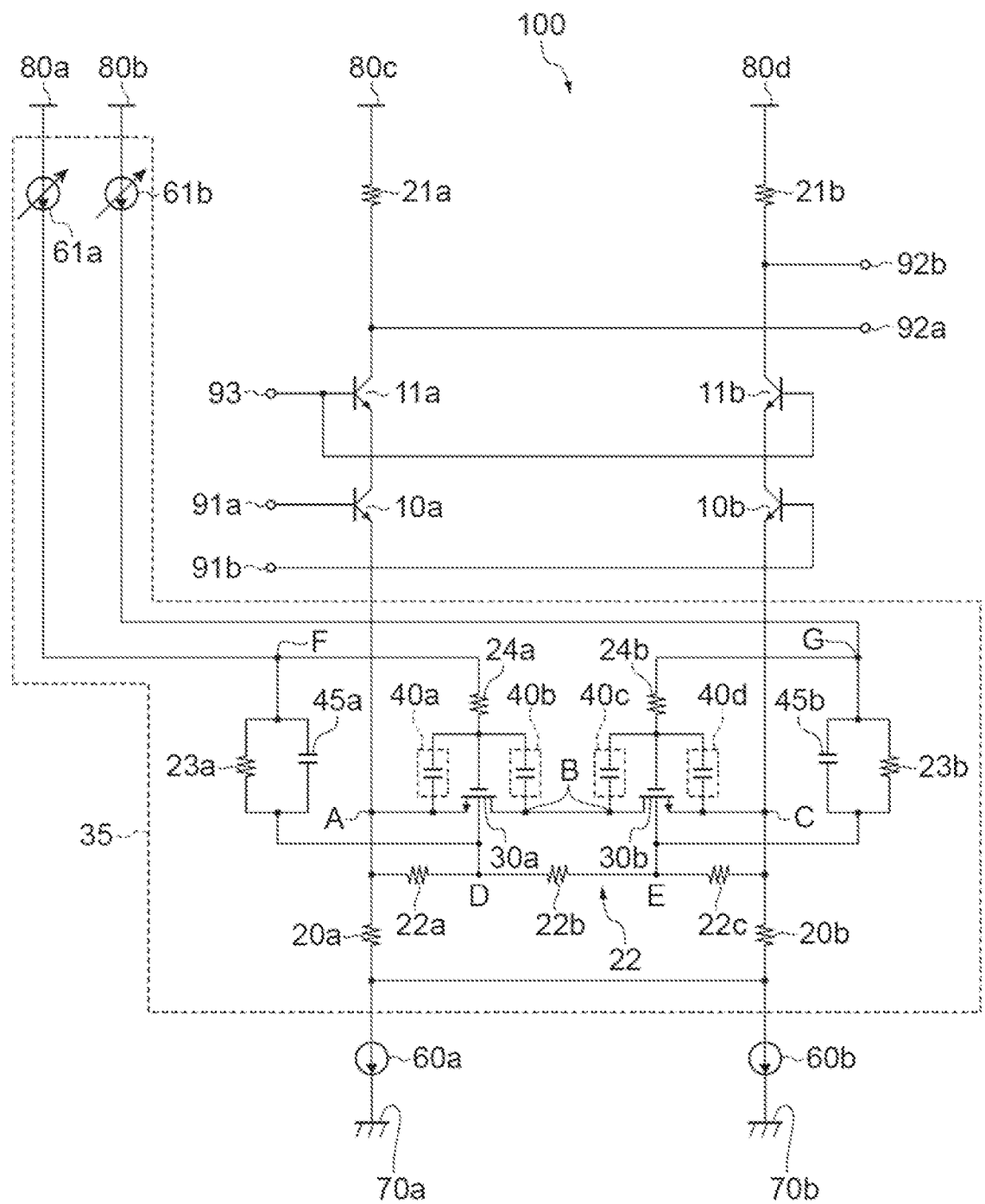
FIG. 2 is a circuit diagram illustrating a constitution of a variable gain amplifier circuit 100 in FIG. 1.

FIG. 2 is a circuit diagram illustrating a constitution of the variable gain amplifier circuit 100 in FIG. 1. The variable gain amplifier circuit 100 is a differential amplifier circuit which amplifies an input voltage signal (input differential signal) and generates an output voltage signal (differential signal). For example, the variable gain amplifier circuit 100 is an integrated circuit which is formed on a Si substrate using a process of a semiconductor such as a SiGe BiCMOS. The maximum power supply voltage of an integrated circuit having the variable gain amplifier circuit 100 mounted therein is 3.3 V, for example. Two input voltage signals to be input are 32 QAM signals, for example, of which the number of symbols modulated by a quadrature amplitude modulation (QAM) method is 32, and a modulation rate of these signals is 100 GBaud.

The variable gain amplifier circuit 100 includes bipolar transistors 10a, 10b, 11a, and 11b, resistive elements (first and second load elements) 21a and 21b, current sources 60a and 60b, a degeneration circuit (variable resistance circuit) 35, input terminals (first and second input terminals) 91a and 91b to which input voltage signals are input, output terminals (first and second output terminals) 92a and 92b from which output voltage signals are output, grounding lines 70a and 70b, a bias supply terminal 93, and power lines 80a, 80b, 80c, and 80d.

Hereinafter, constituent elements constituting the variable gain amplifier circuit 100 will be described.

In the bipolar transistors (first and second transistors) 10a and 10b, bases (control terminals) thereof are connected to the input terminals 91a and 91b respectively, collectors (first current terminals) thereof are connected to emitters of the bipolar transistors 11a and 11b respectively, and emitters (second current terminals) thereof are connected to one ends of the current sources 60a and 60b through resistive elements 20a and 20b of the degeneration circuit 35 respectively. The bipolar transistors 10a and 10b vary currents of the collectors in response to an input voltage signal. For example, the bipolar transistors 10a and 10b may be NPN-type heterojunction bipolar transistors (HBTs). In addition, for example, the bipolar transistors 10a and 10b may be replaced with n-type metal oxide semiconductor (MOS) transistors. In such a case, in the MOS transistors, a gate functions as the control terminal, a drain functions as one current terminal (first current terminal), and a source functions as the other current terminal (second current terminal) One current terminal is a terminal through which a current controlled by the control terminal flows into the transistor, and the other current terminal is a terminal through which a current controlled by the control terminal flows out from the transistor.

In the bipolar transistors 11a and 11b, bases thereof are connected to the bias supply terminal 93, emitters thereof are connected to the collectors of the bipolar transistors 10a and 10b respectively, and collectors thereof are connected to the pair of output terminals 92a and 92b respectively. For example, these bipolar transistors 11a and 11b are cascode transistors. For example, a DC voltage is applied to the bases of the bipolar transistors 11a and 11b via the bias supply terminal 93. Due to such a constitution, voltage amplitudes in the collectors of the bipolar transistors 10a and 10b are regulated, and a Miller effect of base-collector capacitances of the bipolar transistors 10a and 10b is suppressed. Therefore, an operating bandwidth of the variable gain amplifier circuit 100 can be widened. In addition, since an output resistance of the variable gain amplifier circuit 100 increases due to the presence of the bipolar transistors 11a and 11b, a voltage gain of the variable gain amplifier circuit 100 can be improved. For example, the bipolar transistors 11a and 11b may be replaced with n-type MOS transistors. In addition, when the variable gain amplifier circuit 100 has a broad operating bandwidth, the bipolar transistors 11a and 11b may be omitted. Accordingly, the collectors of the bipolar transistors 10a, and 10b are coupled (electrically connected) to the output terminals 92a and 92b via the bipolar transistors 11a and 11b, respectively. The bipolar transistors 11a and 11b may be omitted, so that the collectors of the bipolar transistors 10a and 10b are directly connected to the output terminals 92a and 92b, respectively.

In the resistive elements 21a and 21b, one ends thereof are respectively connected to the output terminals 92a and 92b and the other ends thereof are respectively connected to the power lines 80c and 80d having a second power potential (for example, 3.3 V). These resistive elements 21a and 21b are load elements for converting collector currents of the bipolar transistors 10a and 10b into output voltage signals. For example, n-type poly-Si resistors can be used as the resistive elements 21a and 21b. In the present embodiment, the resistive elements 21a and 21b are the only load elements, but shunt inductors connected to the resistive elements 21a and 21b in series may be included in loads. Accordingly, the resistive elements 21a and 21b may be coupled (electrically connected) to the power lines 80c and 80d via such shunt inductors, respectively. Deterioration in load impedance in a high-frequency region can be curbed and an operating bandwidth of the variable gain amplifier circuit 100 can be widened by including shunt inductors.

In the current sources 60a and 60b, one ends thereof are respectively coupled (electrically connected) to emitters of the bipolar transistors 10a and 10b via the resistive elements 20a and 20b of the degeneration circuit 35, and the other ends thereof are respectively connected to the grounding lines 70a and 70b (first power sources) having a ground potential (first power potential) of 0 V. For example, current mirror circuits constituted of bipolar transistors or MOS transistors are used as the current sources 60a and 60b. In addition, constitutions including only the resistors but not including transistors or constitutions including only the resistors and the inductors may be employed as the current sources 60a and 60b. Moreover, the current sources 60a and 60b may be changed to a constitution of one current source. The resistive elements 20a and 20b may be omitted, as described later.

The degeneration circuit 35 is a circuit in which a resistance between the emitters of the bipolar transistors 10a and 10b is variably set such that the voltage gain of the variable gain amplifier circuit 100 is controlled. Namely, the voltage gain of the variable gain amplifier circuit 100 is mainly determined based on the ratio of the resistance values determined by the resistive elements 21a and 21b on the collector side of the bipolar transistors 10a and 10b to the resistance values set by the degeneration circuit 35 on the emitter side of the bipolar transistors 10a and 10b. For example, if the emitter-side resistance values with respect to the collector-side resistance values decrease, the voltage gain increases. This degeneration circuit 35 has a node (first node) A which is connected to the emitter of the bipolar transistor 10a and a node (second node) C which is connected to the emitter of the bipolar transistor 10b and includes MOS transistors (first and second field effect transistors) 30a and 30b which are connected in series between the node A and the node C, a series resistor circuit 22 which is connected between the node A and the node C, current sources (first and second variable current sources) 61a and 61b which generate variable currents, the resistive elements 20a and 20b, resistive elements (first and second gate connection resistors) 24a and 24b, resistive elements (first and second bias resistors) 23a and 23b, and capacitors (first and second capacitors) 45a and 45b. Hereinafter, constituent elements of the degeneration circuit 35 will be described in detail.

The resistive elements 20a and 20b are respectively connected between the emitters of the bipolar transistors 10a and 10b and one ends of the current sources 60a and 60b. These resistive elements 20a and 20b are elements for enabling expansion of a linear input range of the variable gain amplifier circuit 100, and the resistance value thereof is set to 100 Ω, for example. When the linear input range of the variable gain amplifier circuit 100 is wider than a usage range (input range of a differential signal) or the like, the resistive elements 20a and 20b may be omitted.

In the MOS transistors 30a and 30b, the sources (current terminals) thereof are connected to the nodes A and C respectively, and the drains (current terminals) thereof are connected to a node B. These MOS transistors 30a and 30b may be MOS transistors of the same kind and the same size. Moreover, the MOS transistors 30a and 30b may have the same electrical characteristics. For example, the MOS transistors 30a and 30b are n-type MOS transistors. These MOS transistors 30a and 30b respectively include gate-source capacitances 40a and 40d and gate-drain capacitances 40b and 40c. It is preferable that these capacitances 40a, 40b, 40c, and 40d be approximately equal to each other, and therefore the layout of the MOS transistors 30a and 30b (a two dimensional shape when a semiconductor chip is viewed from above) may be set to be line symmetrical on the source side and the drain side about the gate. When the capacitances 40a and 40d and the capacitances 40b and 40c are different from each other, the values of the gate-source capacitances of the MOS transistors 30a and 30b and the values of the gate-drain capacitances of the MOS transistors 30a and 30b may be set to be approximately equal to each other by adding a capacitor. When the transistors are used by replacing the source and the drain with each other, in a case in which electrical characteristics before being replaced and electrical characteristics after being replaced are different from each other within a practically tolerable range, the transistors have symmetry with respect to the drain and the source. For example, in the case of transistors having symmetry, the drain and the source may be used by being replaced with each other.

The series resistor circuit 22 is a circuit in which three resistive elements (first to third dividing resistors) 22a, 22b, and 22c are connected in series between the node A and the node C. This series resistor circuit 22 generates two setting voltages (first and second setting voltages) V1 and V2 by dividing a voltage between the node A and the node C at a node (connection point, first dividing node) D between the resistive element 22a and the resistive element 22b and a node (connection point, second dividing node) E between the resistive element 22b and the resistive element 22c. The nodes D, E are examples of voltage dividing node.

Specifically, in the resistive element 22a, one end thereof is connected to the node A, and the other end thereof is connected to the node D. In the resistive element 22b, one end thereof is connected to the node D, and the other end thereof is connected to the node E. In the resistive element 22c, one end thereof is connected to the node E, and the other end thereof is connected to the node C. For example, regarding the resistance values of the resistive elements 22a, 22b, and 22c, it is preferable that the ratios thereof be approximately equal to 1:2:1. For example, they are 1 kΩ, 2 kΩ, and 1 kΩ, respectively. For example, being approximately equal denotes that they may be different within a practically tolerable range. For example, being within a practically tolerable range indicates a range of within 5% in terms of relative error. In addition, the nodes D and E of the series resistor circuit 22 are respectively connected to back gates of the MOS transistors 30a and 30b. Accordingly, the influences of substrate bias effects occurring in the MOS transistors 30a and 30b can be made substantially equal to each other.

The resistive elements 24a and 24b are respectively connected between gate connection nodes F and G and the gates of the MOS transistors 30a and 30b. The nodes F and G may have some parasitic capacitances (not shown) between the nodes F and G and the grounding lines 70a and 70b. These resistive elements 24a and 24b are elements for separating such parasitic capacitances of the nodes F and G from the MOS transistors 30a and 30b. Namely, electrical influence originated from the parasitic capacitances of the nodes F and G on the gates of the MOS transistors 30a and 30b is reduced. It is preferable that the resistance values of the resistive elements 24a and 24b be set such that they are approximately equal to each other, and the resistance values thereof are set to 5 kΩ, for example.

The resistive element 23a and the capacitor 45a are connected in parallel between the node F and the node D. In addition, the resistive element 23b and the capacitor 45b are connected in parallel between the node G and the node E. These parallel circuits form voltage transmission paths for causing voltage fluctuations of the gates of the MOS transistors 30a and 30b to coincide with voltage fluctuations of the nodes D and E in frequency bands in a lower range (for example, 100 MHz or lower) and a middle range (for example, 100 MHz to 10 GHz). The resistance values of the resistive elements 23a and 23b are set to 15 kΩ, for example, and the capacitances of the capacitors 45a and 45b are set to 1 pF, for example.

The current sources 61a and 61b are respectively connected between the power lines 80a and 80b having the second power potential and the nodes F and G and generate a variable current flowing from the output terminals thereof toward the nodes F and G. Currents output by the current sources 61a and 61b flow into the current sources 60a and 60b through the resistive elements 23a and 23b and the resistive elements 22a, 22b, and 22c. Accordingly, DC voltage components based on back gate voltages thereof can be applied to the gates of the MOS transistors 30a and 30b. The output resistances of the current sources 61a and 61b are high. Therefore, as described below, in the MOS transistors 30a and 30b, the voltage fluctuations between the gate and the back gate can be made substantially equal to each other. Current values output by these current sources 61a and 61b are set to 50 μA, for example. It is preferable that the current sources 61a and 61b be constituted of current mirror circuits including MOS transistors and the current values output by these be set such that they are approximately equal to each other.

Next, operation of the variable gain amplifier circuit 100 will be described.

If an input voltage signal is input to the input terminals 91a and 91b, emitter potentials of the bipolar transistors 10a and 10b fluctuate. Since these emitter potentials follow the base potential, fluctuation amounts thereof depend on input amplitudes. When the potential of the input terminal 91a decreases, the emitter potential of the bipolar transistor 10a decreases. Similarly, when the potential of the input terminal 91b increases, the emitter potential of the bipolar transistor 10b increases. Accordingly, the source potential of the MOS transistor 30a (potential of the node A) decreases, and the source potential of the MOS transistor 30b (potential of the node C) increases.

The gate potentials of the MOS transistors 30a and 30b similarly fluctuate at a broad frequency band. First, in a frequency band in a higher range (for example, 10 GHz or higher), the gate potentials of the MOS transistors 30a and 30b fluctuate due to voltage dividing action by the capacitances 40a, 40b, 40c, and 40d. In the present embodiment, the capacitances 40a, 40b, 40c, and 40d are approximately equal to each other. Therefore, when the voltage fluctuation of the node A is Va and the voltage fluctuation of the node C is Vc, the fluctuation of the gate potential of the MOS transistor 30a is calculated by Va+(¼)(Vc−Va)=(¾)Va+(¼)Vc, and the fluctuation of the gate potential of the MOS transistor 30b is calculated by Va+(¾)(Vc−Va)=(¼)Va+(¾)Vc. In the present embodiment, since the variable gain amplifier circuit 100 amplifies a differential signal, voltage fluctuation Va=−Vc is established. In this case, the fluctuation of the gate potential of the MOS transistor 30a becomes (½)Va, and the fluctuation of the gate potential of the MOS transistor 30b becomes −(½)Va. The fluctuations thereof become fluctuations having amplitudes equal to each other and having inverted phases each other.

In the frequency bands in the lower range and the middle range described above, the fluctuations of the gate potentials of the MOS transistors 30a and 30b respectively become approximately equal to the fluctuations of the potentials of the nodes D and E. In the present embodiment, since the resistance ratio of the resistive elements 22a, 22b, and 22c is 1:2:1, the potential fluctuation of the node D becomes Va+(¼)(Vc−Va)=(¾)Va+(¼)Vc=(½)Va, and the potential fluctuation of the node E is calculated by Va+(¾)(Vc−Va)

=(¼)Va+(¾)Vc=−(½)Va. In the case of a lower range, the potential fluctuations of the gates of the MOS transistors 30a and 30b respectively become approximately equal to the potential fluctuations of the nodes D and E, via the resistive elements 23a, 23b, 24a, and 24b. In the case of a middle range, the potential fluctuations of the gates of the MOS transistors 30a and 30b respectively become approximately equal to the potential fluctuations of the nodes D and E, via the capacitors 45a and 45b and the resistive elements 24a and 24b.

Figure 3:
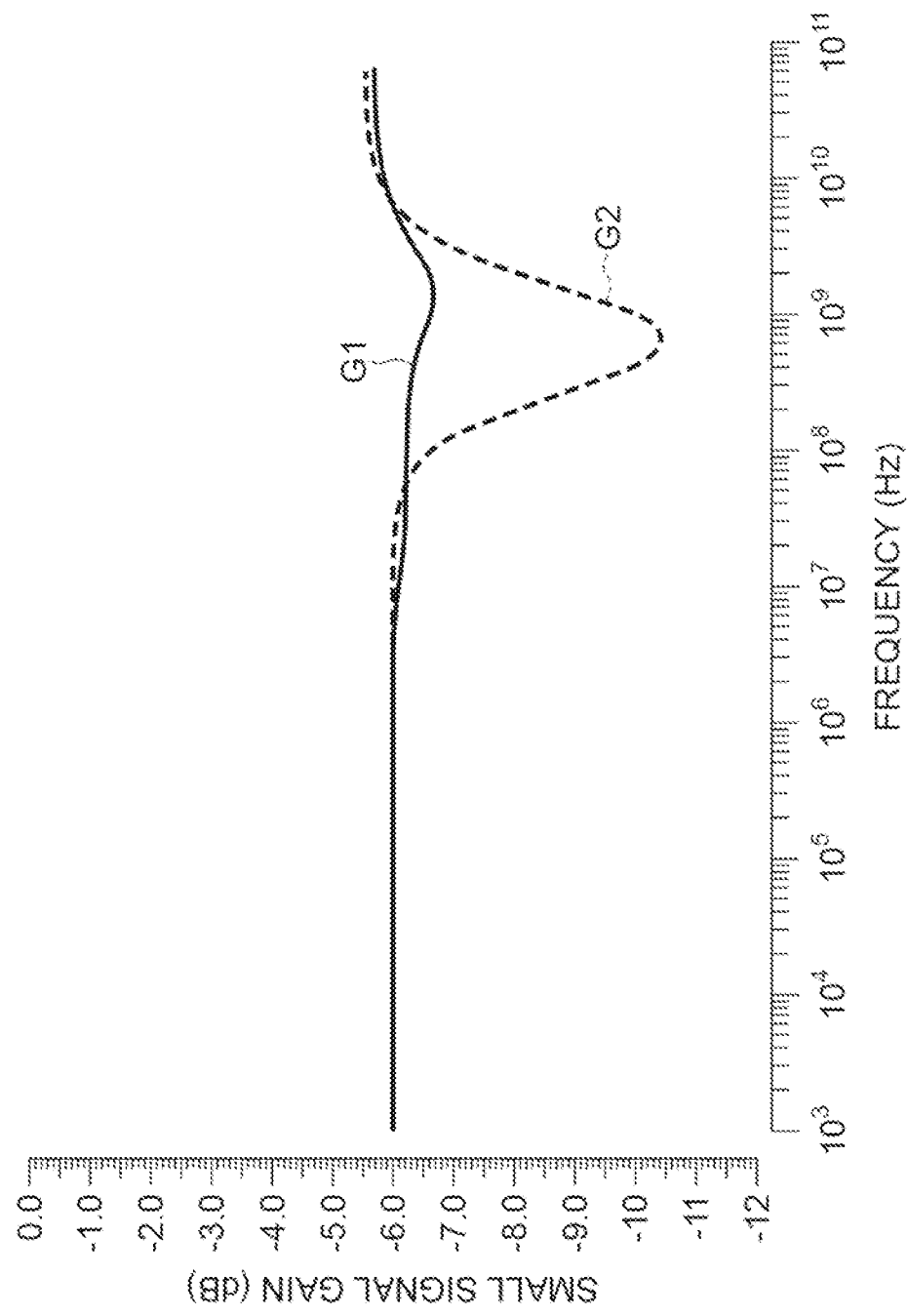
FIG. 3 is a graph showing frequency characteristics of a small signal gain of a gate with respect to a source of an MOS transistor 30a in FIG. 2.

FIG. 3 shows frequency characteristics of a small signal gain of the gate with respect to the source (node A) of the MOS transistor 30a. The solid line G1 indicates frequency characteristics when the capacitors 45a and 45b are present, and the dotted line G2 indicates frequency characteristics when the capacitors 45a and 45b are not present. As shown in these characteristics, when the capacitors 45a and 45b are present, the small signal gain becomes approximately −6 dB over a range from 1 kHz to 50 GHz, and the potential fluctuation of the gate of the MOS transistor 30a becomes approximately half the potential fluctuation of the source. Meanwhile, when the capacitors 45a and 45b are not present, the small signal gain becomes small in a range of 100 MHz to 10 GHz, and the potential fluctuation of the gate of the MOS transistor 30a becomes smaller than half the potential fluctuation of the source. From such characteristics, it is understood that the potential fluctuations of the gates of the MOS transistors 30a and 30b in the range of 100 MHz to 10 GHz are caused by the capacitors 45a and 45b. That is, the fluctuation of the gate potential of each of the MOS transistors 30a and 30b is set to approximately half the fluctuation of each of the source potentials (potentials of the nodes A and C) by the resistive elements 22a, 22b, and 22c and the resistive elements 23a, 23b, 24a, and 24b in the lower range (a band of 100 MHz or lower), by the resistive elements 22a, 22b, and 22c, the capacitors 45a and 45b, and the resistive elements 24a and 24b in the middle range (a band of 100 MHz to 10 GHz), and by the capacitances 40a, 40b, 40c, and 40d in the higher range (a band of 10 GHz or higher). In this manner, in a broad frequency band, the fluctuations of the gate potentials of the MOS transistors 30a and 30b become approximately half the fluctuation of the source potential.

Figure 4:
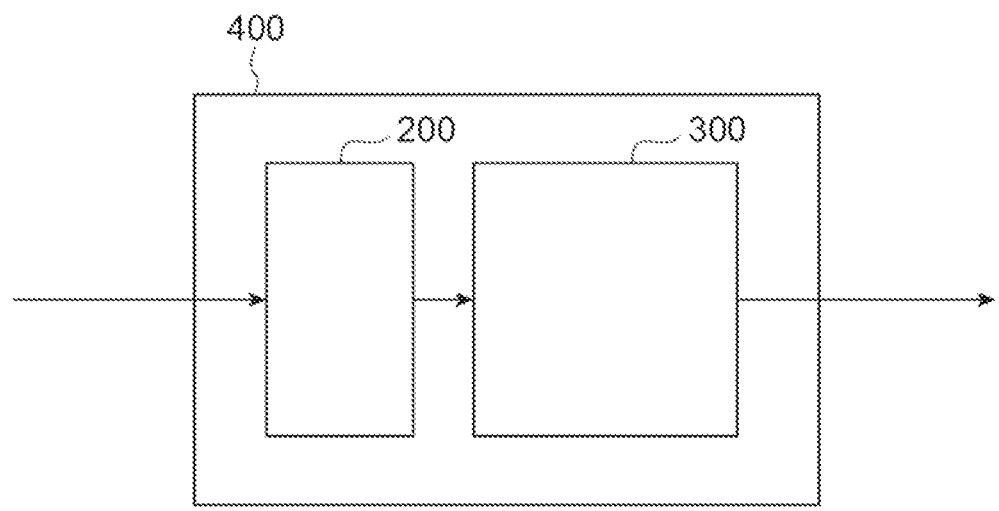
FIG. 4 is a block diagram illustrating a constitution of an optical transmitter module 400 according to the embodiment.

FIG. 4 illustrates a constitution of an optical transmitter module 400 according to the present embodiment. The optical transmitter module 400 includes the drive circuit 200 described above, and an optical modulation device 300. For example, the drive circuit 200 amplifies and outputs four input differential signals, and the optical modulation device 300 generates an optical signal modulated on the basis of the four differential signals output from the drive circuit 200 and outputs one optical signal subjected to optical polarization division multiplexing QAM modulation, for example. The optical modulation device 300 may generate four optical signals having peak wavelengths different from each other on the basis of the four differential signals. For example, the optical modulation device 300 outputs four optical signals subjected to PAM modulation. In this case, the optical transmitter module 400 may further include an optical multiplexer, which multiplexes four optical signals using the optical multiplexer and generates and outputs one wavelength division multiplex signal. For example, the optical transmitter module 400 is an optical module in which the drive circuit 200 and the optical modulation device 300 are integrated and mounted in a ceramic package and which has an external shape of 30 mm×15 mm×5 mm, for example. According to the optical transmitter module 400 having the foregoing constitution, the drive circuit 200 having the variable gain amplifier circuit 100 mounted therein is used. Therefore, an optical transmitter module having excellent linearity and a small area capable of performing broadband modulation is realized.

Figure 5:
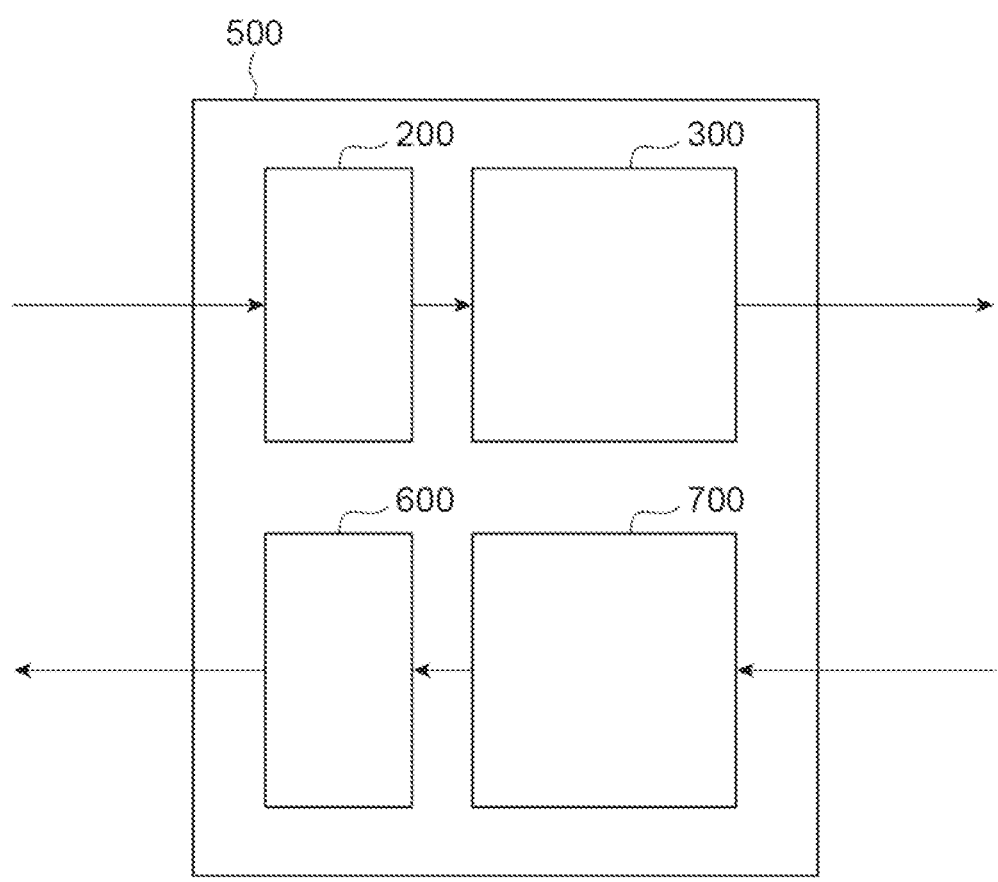
FIG. 5 is a block diagram illustrating a constitution of an optical transceiver module 500 according to the embodiment.

FIG. 5 illustrates a constitution of an optical transceiver module 500 according to the present embodiment. The optical transceiver module 500 includes a reception circuit 600 and a light receiving device 700 in addition to the drive circuit 200 and the optical modulation device 300 described above. The light receiving device 700 receives an optical signal input from the outside through an optical transmission line, separates four signals (light reception currents) from an optical signal subjected to optical polarization division multiplexing QAM modulation, for example, and outputs the signals. The reception circuit 600 converts four light reception currents into voltages and amplifies and outputs the voltages. According to the optical transceiver module 500 having the foregoing constitution, the drive circuit 200 having the variable gain amplifier circuit 100 mounted therein is used. Therefore, an optical transceiver module having excellent linearity and a small area capable of performing broadband modulation is realized.

According to the variable gain amplifier circuit 100 of the present embodiment described above, when each of collector currents of the bipolar transistors 10a and 10b is modulated based on input voltage signals that are differential signals input from the input terminals 91a and 91b, output voltage signals (differential signals) are output from the output terminals 92a and 92b. At this time, since the resistance value of the degeneration circuit 35 connected between the emitters of the bipolar transistors 10a and 10b is variably set, voltage gains in two output voltage signals can be adjusted. Here, the degeneration circuit 35 includes the MOS transistors 30a and 30b connected in series between the emitters of the bipolar transistors 10a and 10b so that a variable DC voltage component based on the nodes D and E can be applied to each of the gates of the MOS transistors 30a and 30b. Moreover, since the nodes D and E are connected to the gates of the MOS transistors 30a and 30b through the resistive elements 23a, 23b, 24a, and 24b, the gate potentials of the MOS transistors 30a and 30b can fluctuate in association with the fluctuations of the source potentials of the MOS transistors 30a and 30b in accordance with the fluctuation of an input voltage signal in a broad frequency band. As a result, differential amplification having high linearity is realized, and linearity of an output voltage signal in a broad frequency band can be improved.

In addition, in the present embodiment, the degeneration circuit 35 is further provided with the capacitors 45a and 45b respectively connected between the output terminals of the current sources 61a and 61b and the nodes D and E. Due to such a constitution, the gate potentials of the MOS transistors 30a and 30b can fluctuate in association with the fluctuations of the source potentials of the MOS transistors 30a and 30b in a broad frequency band region including the middle range. As a result, linearity of an output voltage signal in a broader frequency band can be improved.

In addition, in the present embodiment, as the series resistor circuit 22, the degeneration circuit 35 has the resistive element 22a connected between the node A and the node D, the resistive element 22b connected between the node D and the node E, and the resistive element 22c connected between the node E and the node C. The resistive element 22a and the resistive element 22c have resistance values equal to each other, and the resistance value of the resistive element 22b is twice the resistance values of the resistive elements 22a and 22c. For example, resistance values equal to each other may be resistance values which are different from each other within a range of tolerable manufacturing variation and are not limited to being resistance values which completely coincide with each other. For example, the range of tolerable manufacturing variation is 5% in the relative error. In addition, for example, twice the resistance values may be resistance values different from the resistance values twice the resistance values within the range of tolerable manufacturing variation and is not limited to being resistance values which completely coincide with resistance values which are twice the resistance values. Due to such a constitution, the gate voltages of the two MOS transistors 30a and 30b can fluctuate with a magnitude which is half the fluctuations of the source potentials of the MOS transistors 30a and 30b. As a result, linearity of an output voltage signal in a broad frequency band can be further improved.

Moreover, in the present embodiment, the nodes D and E of the series resistor circuit 22 are respectively connected to the back gates of the MOS transistors 30a and 30b. Due to the constitution, the influences of substrate bias effects occurring in the MOS transistors 30a and 30b can be made substantially equal to each other. As a result, linearity of an output voltage signal in a broad frequency band can be more stably improved. The nodes D and E may not be respectively connected to the back gates of the MOS transistors 30a and 30b.

In addition, the variable gain amplifier circuit 100 is built into the drive circuit 200 according to the present embodiment. For this reason, due to the drive circuit 200, signal amplification having excellent linearity can be performed in a broad frequency band.

Here, effects of the present embodiment will be described in comparison with a comparative example.

Figure 12:
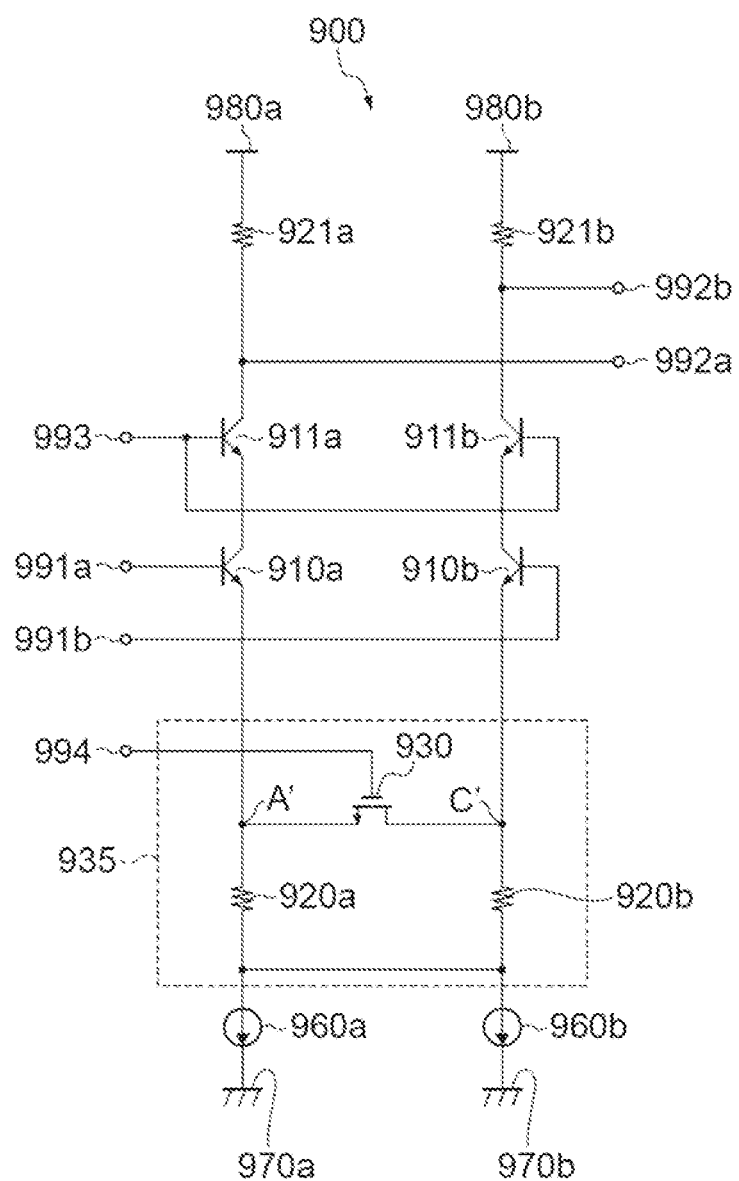
FIG. 12 is a circuit diagram illustrating a constitution of a variable gain amplifier circuit 900 of a comparative example.

FIG. 12 is a circuit diagram illustrating a constitution of a variable gain amplifier circuit 900 of a comparative example. The variable gain amplifier circuit 900 includes bipolar transistors 910a, 910b, 911a, and 911b, resistive elements 921a and 921b, a degeneration circuit 935, current sources 960a and 960b, input terminals 991a and 991b, output terminals 992a and 992b, grounding lines 970a and 970b, bias supply terminals 993 and 994, and power lines 980a and 980b. The degeneration circuit 935 includes an MOS transistor 930 and resistive elements 920a and 920b.

In the variable gain amplifier circuit 900 of the comparative example, the constitution of the degeneration circuit 935 differs from that of the variable gain amplifier circuit 100. That is, the degeneration circuit 935 functions such that the source-drain resistance of the MOS transistor 930 varies in accordance with a DC voltage supplied from the bias supply terminal 994 to the gate of the MOS transistor 930. Accordingly, the voltage gain of the variable gain amplifier circuit 900 can be controlled. The size of the MOS transistor 930 is set to half the sizes of the MOS transistors 30a and 30b. Due to such a constitution, the smallest value of the resistance between a node A' and a node C' of the variable gain amplifier circuit 900 and the smallest value of the resistance between the node A and the node C of the variable gain amplifier circuit 100 can be made equal to each other.

FIGS. 6A and 6B are graphs respectively showing variation in output amplitude and variation in total harmonic distortion (THD) of an output voltage signal when gains of the variable gain amplifier circuits 100 and 900 are varied. FIG. 6A shows variation in output amplitude, and FIG. 6B shows variation in THD. In these graphs, the horizontal axis indicates the magnitude of a gain (larger to the right side), and the vertical axis indicates the output amplitude or the magnitude of THD (larger to the upper side). The solid line indicates characteristics of the variable gain amplifier circuit 100, and the dotted line indicates characteristics of the variable gain amplifier circuit 900. As shown in these graphs, substantially equal output amplitude is obtained in the variable gain amplifier circuit 100 and the variable gain amplifier circuit 900. Meanwhile, regarding the gain indicated by the arrow, the THD of the variable gain amplifier circuit 900 increases, whereas the THD of the variable gain amplifier circuit 100 is regulated to a low level.

Figure 7:
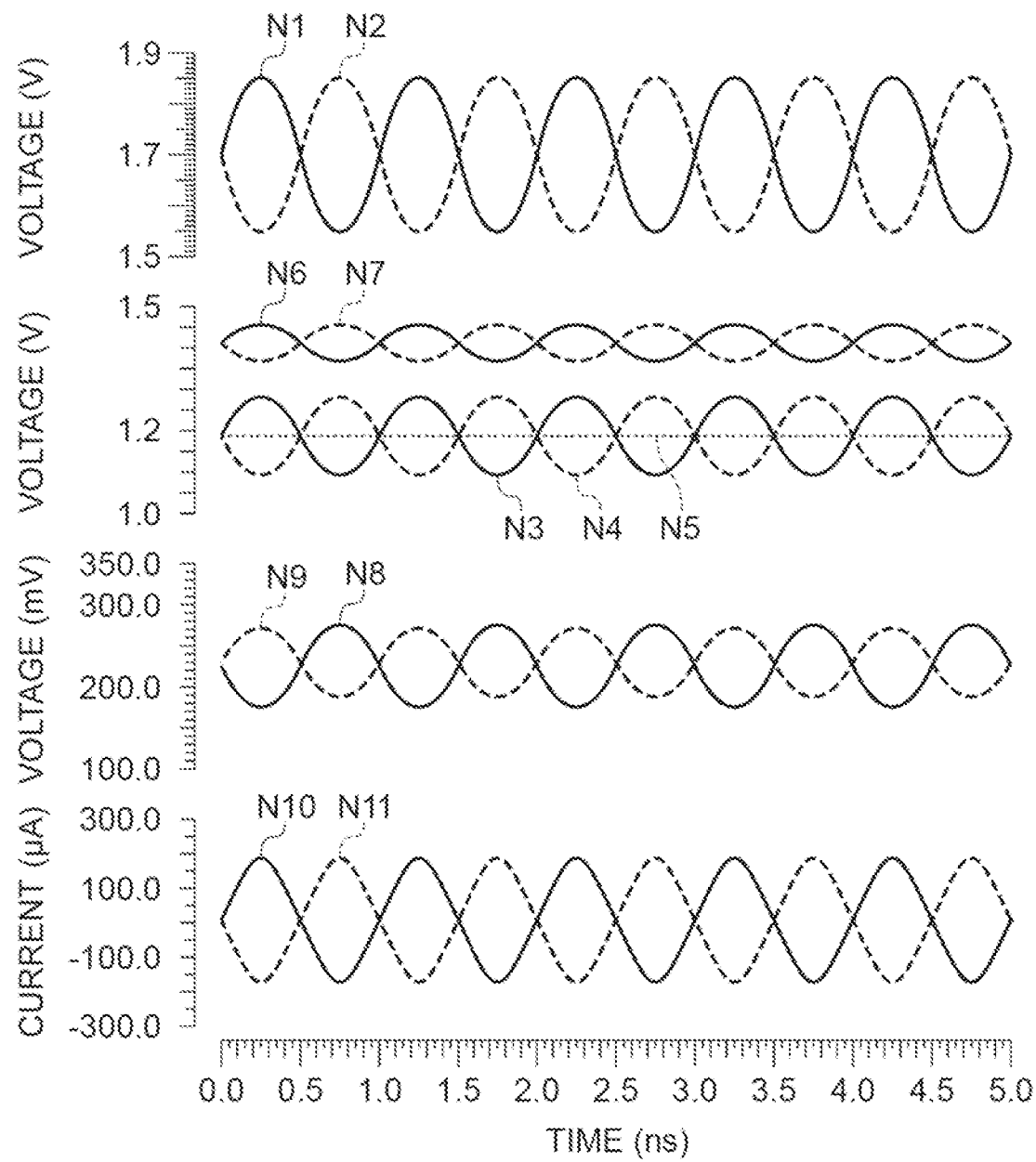
FIG. 7 is graphs showing signal waveforms of respective terminals in the variable gain amplifier circuit 100 according to the embodiment.
Figure 13:
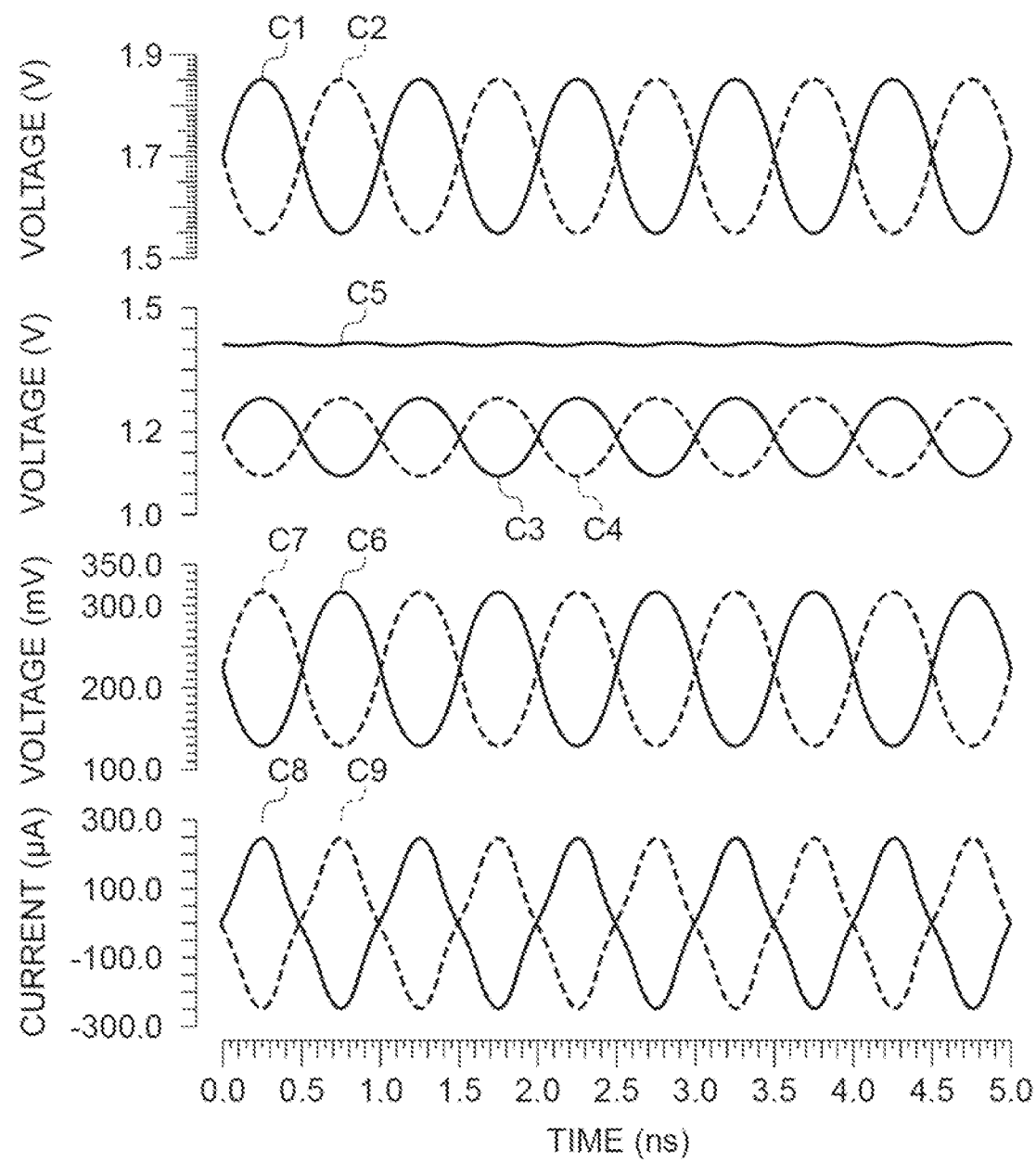
FIG. 13 is graphs showing signal waveforms of respective terminals in the variable gain amplifier circuit 900 of the comparative example.

FIGS. 7 and 13 show signal waveforms of respective terminals in gains indicated by the arrow in FIG. 6B.

FIG. 13 shows, as signal waveforms of the variable gain amplifier circuit 900, voltage waveforms C1 and C2 of the input terminals 991a and 991b, a voltage waveform C3 of the source (node A') of the MOS transistor 930, a voltage waveform C4 of the drain (node C') of the MOS transistor 930, a voltage waveform C5 of the gate of the MOS transistor 930, a waveform C6 of the gate-source voltage of the MOS transistor 930, a waveform C7 of the gate-drain voltage of the MOS transistor 930, a waveform C8 of a current from the node A' toward the node C', and a waveform C9 of a current from the node C' toward the node A', respectively. In this manner, in the comparative example, the gate voltage of the MOS transistor 930 increases (waveform C5), and the gate-source voltage (waveform C6) and the gate-drain voltage (waveform C7) of the same transistor have values close to a threshold voltage (for example, 250 mV). In this state, when input voltage signals (waveforms C1 and C2) are applied to the input terminals 991a and 991b, the source-drain voltage of the MOS transistor 930 fluctuates (waveforms C3 and C4). Accordingly, the gate-source voltage (waveform C6) and the gate-drain voltage (waveform C7) of the MOS transistor 930 fluctuate and exceed the threshold voltage when these voltages increase. As a result, a current flows between the drain and the source of the MOS transistor 930 (waveforms C8 and C9). These currents have triangular wave-shaped waveforms and have large THD (for example, 9%). Thus, as illustrated in FIG. 6B, the THD in an output waveform increases.

FIG. 7 shows, as signal waveforms of the variable gain amplifier circuit 100, voltage waveforms N1 and N2 of the input terminals 91a and 91b, a voltage waveform N3 of the source (node A) of the MOS transistor 30a, a voltage waveform N4 of the source (node C) of the MOS transistor 30b, a voltage waveform N5 of the drain (node B) of the MOS transistors 30a and 30b, a voltage waveform N6 of the gate of the MOS transistor 30a, a voltage waveform N7 of the gate of the MOS transistor 30b, a waveform N8 of the gate-source voltage of the MOS transistor 30a, a waveform N9 of the gate-drain voltage of the MOS transistor 30a, a waveform N10 of a current from the node A toward the node C, and a waveform N11 of a current from the node C toward the node A, respectively. In this manner, in the embodiment, the gate voltages of the MOS transistors 30a and 30b increases (waveforms N6 and N7), and the gate-source voltage (waveform N8) and the gate-drain voltage (waveform N9) of the MOS transistor 30a have values close to the threshold voltage (for example, 250 mV). In this state, when input voltage signals (waveforms N1 and N2) are applied to the input terminals 91a and 91b, the source voltages of the MOS transistors 30a and 30b fluctuate (waveforms N3 and N4), but the gate voltages of the MOS transistors 30a and 30b also fluctuate (waveforms N6 and N7). As described above, these fluctuations become approximately half the fluctuations of the source voltages of the MOS transistors 30a and 30b. Accordingly, the fluctuations of the gate-source voltage (waveform N8) and the gate-drain voltage (waveform N9) of the MOS transistor 30a become approximately half the fluctuation of the variable gain amplifier circuit 900. The same also applies to the fluctuations of the gate-source voltage and the gate-drain voltage of the MOS transistor 30b. As a result, currents (waveforms N10 and N11) flowing between the node A and the node C are smaller than that of the variable gain amplifier circuit 900, and the THD thereof is also small (for example, 3.5%). Therefore, as illustrated in FIG. 6B, the THD in the output waveform is regulated to a low level.

FIGS. 8A and 8B are graphs respectively showing frequency dependency of variation in output amplitude and variation in THD with respect to the gain of the variable gain amplifier circuit 100. FIG. 8A shows variation in output amplitude, and FIG. 8B shows variation in THD. In these graphs, the horizontal axis indicates the magnitude of a gain (larger to the right side), and the vertical axis indicates the magnitude of the output amplitude or the THD (larger to the upper side). The graphs show variation when the frequency is 1 MHz, 1 GHz, and 10 GHz. As shown in these graph, it is ascertained that the frequency dependencies of the output amplitude and the THD in the variable gain amplifier circuit 100 are low. This is because, as described above, the potential fluctuations of the gates of the MOS transistors 30a and 30b are approximately half the potential fluctuation of the source in a broad frequency band.

In this manner, according to the present embodiment, a variable gain amplifier circuit having excellent linearity in a broad frequency band can be provided.

The technologies in the related art described in Japanese Unexamined Patent Publication No. H8-256039, Japanese Unexamined Patent Publication No. H11-168334, Japanese Unexamined Patent Publication No. 2004-304775, and the like have a constitution in which two MOS transistors are connected in series between sources or emitters of two transistors receiving input voltage signals. Even in such a constitution, there is a probability that the THD will be reduced in the higher range (for example, 10 GHz). However, in this constitution, since the gate voltages of two MOS transistors coincide with each other and have unique potentials in the lower range and the middle range, the THD cannot be reduced. Meanwhile, in the present embodiment, the fluctuations of the gate voltages can be made substantially unique in ranges from the lower range to the higher range. Therefore, the THD can be reduced to a low level over a broad frequency band.

Here, in the present embodiment, the node D is connected to the back gate of the MOS transistor 30a, and the node E is connected to the back gate of the MOS transistor 30b, respectively. However, the mutual conductance in the back gate is generally smaller than the mutual conductance in the gate. Therefore, when the influence of a substrate bias effect is small, the back gates of the MOS transistors 30a and 30b may be set to independently fixed potentials.

Figure 9:
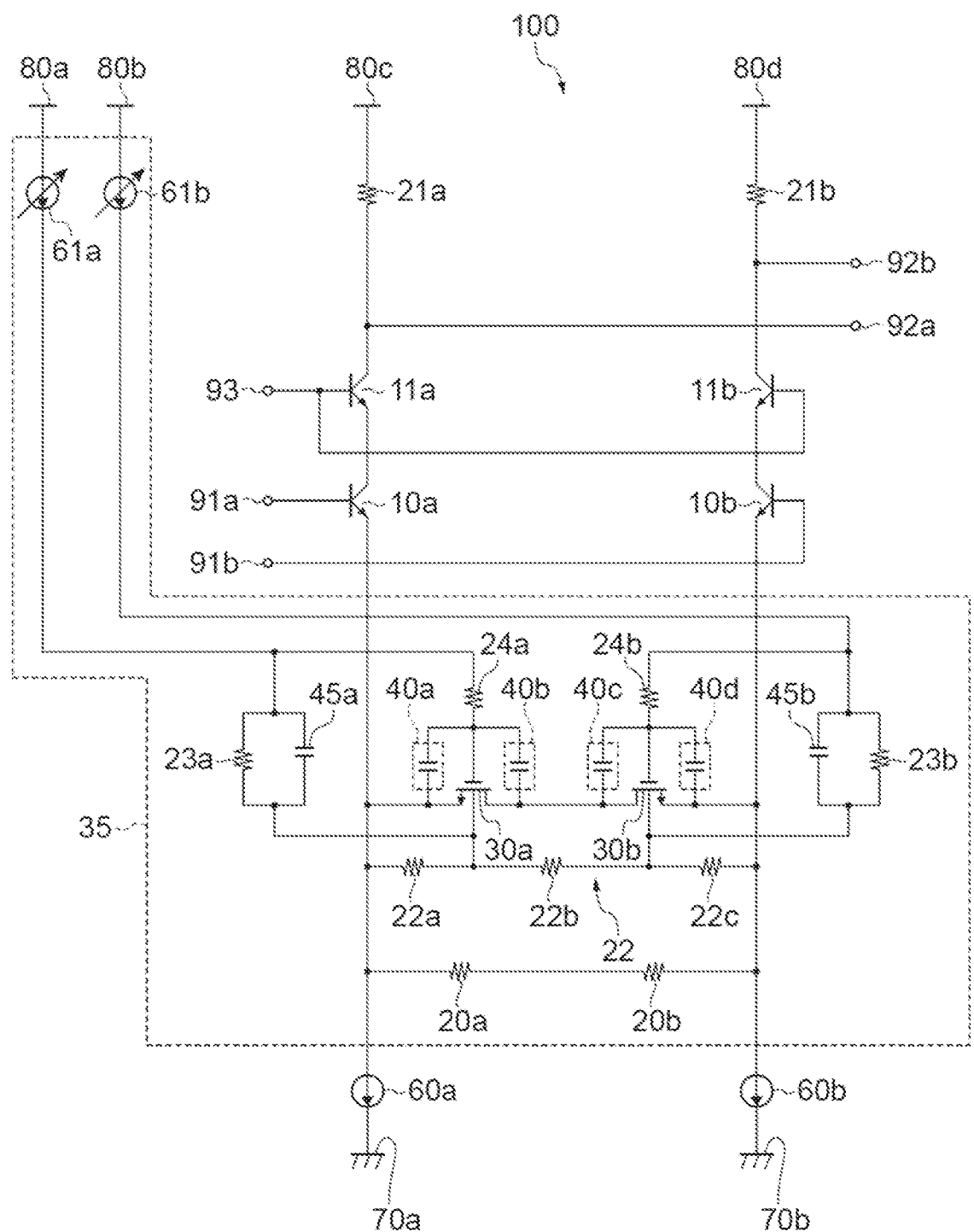
FIG. 9 is a circuit diagram illustrating a modification example of a constitution of the variable gain amplifier circuit 100.

In addition, the constitution of the variable gain amplifier circuit 100 may be changed to the constitution illustrated in FIG. 9. That is, the resistive elements 20a and 20b may be constituted such that they are connected in series between one end of the current source 60a and one end of the current source 60b. Due to such a constitution as well, the resistance between the emitters of the bipolar transistors 10a and 10b is maintained. Accordingly, decrease in a DC voltage by the resistive elements 20a and 20b is prevented. Therefore, bias voltages of the current sources 60a and 60b can be increased.

In addition, a constitution in which the resistive elements 20a and 20b are omitted may be employed by adjusting the resistance values of the resistive elements 22a, 22b, and 22c. For example, in the embodiment described above, the resistance values of the resistive elements 22a, 22b, and 22c are respectively set to 1 kΩ, 2 kΩ, and 1 kΩ, and each of the resistance values of the resistive elements 20a and 20b is set to 100 Ω, but the resistive elements 20a and 20b can be omitted by respectively setting the resistance values of the resistive elements 22a, 22b, and 22c to 50 Ω, 100 Ω, and 50 Ω.

Hereinabove, principles of the present disclosure have been illustrated and described with a preferable embodiment, but it is recognized by those skilled in the art that disposition and details of the present disclosure can be changed without departing from such principles. The present disclosure is not limited to particular constitutions disclosed in the present embodiment. Therefore, the rights are claimed on all the modifications and changes from the claims and the scope of the spirit thereof.

Figure 10:
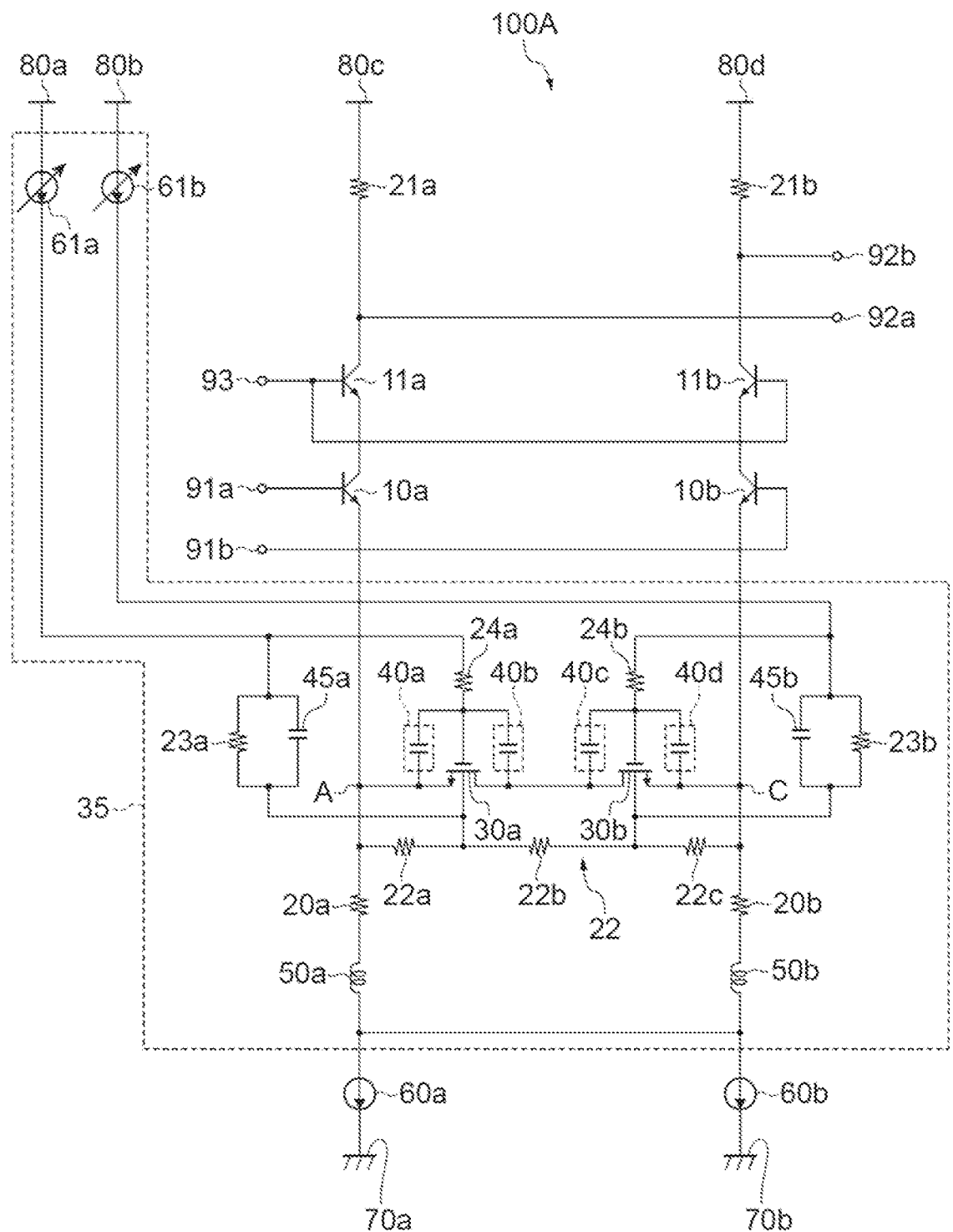
FIG. 10 is a circuit diagram illustrating a constitution of a variable gain amplifier circuit 100A according to a modification example.

FIG. 10 illustrates a constitution of a variable gain amplifier circuit 100A according to a modification example. The constitution of this variable gain amplifier circuit 100A differs from that of the embodiment described above in that inductors 50a and 50b are newly added.

That is, in the variable gain amplifier circuit 100A, the inductor (first inductor) 50a connected between one end of the current source 60a and the node A and the inductor (second inductor) 50b connected between one end of the current source 60b and the node C are newly provided. These inductors 50a and 50b are elements for compensating a high-frequency loss of the degeneration circuit 35. Spiral inductors in which lines are laid out in spiral shapes can be used as the inductors 50a and 50b.

In the embodiment described above, linearity can be improved by connecting two MOS transistors 30a and 30b in series between the emitters of the bipolar transistors 10a and 10b. However, in order to maintain the resistance between the node A and the node C, there is a need to double the sizes of the MOS transistors 30a and 30b compared to a case of connecting one MOS transistor. In this case, a source-ground capacitance in the nodes A and C increases. Therefore, the impedance of the degeneration circuit 35 decreases at a high frequency, the voltage gain of the variable gain amplifier circuit 100A increases, and the THD increases. As a result, linearity may deteriorate. Meanwhile, according to the present modification example, since the inductors 50a and 50b are included, the impedance of the degeneration circuit 35 can be maintained at a high frequency. As a result, increases in a voltage gain of the variable gain amplifier circuit 100A in a high-frequency band can be curbed, and excellent linearity can be maintained.

Figure 11:
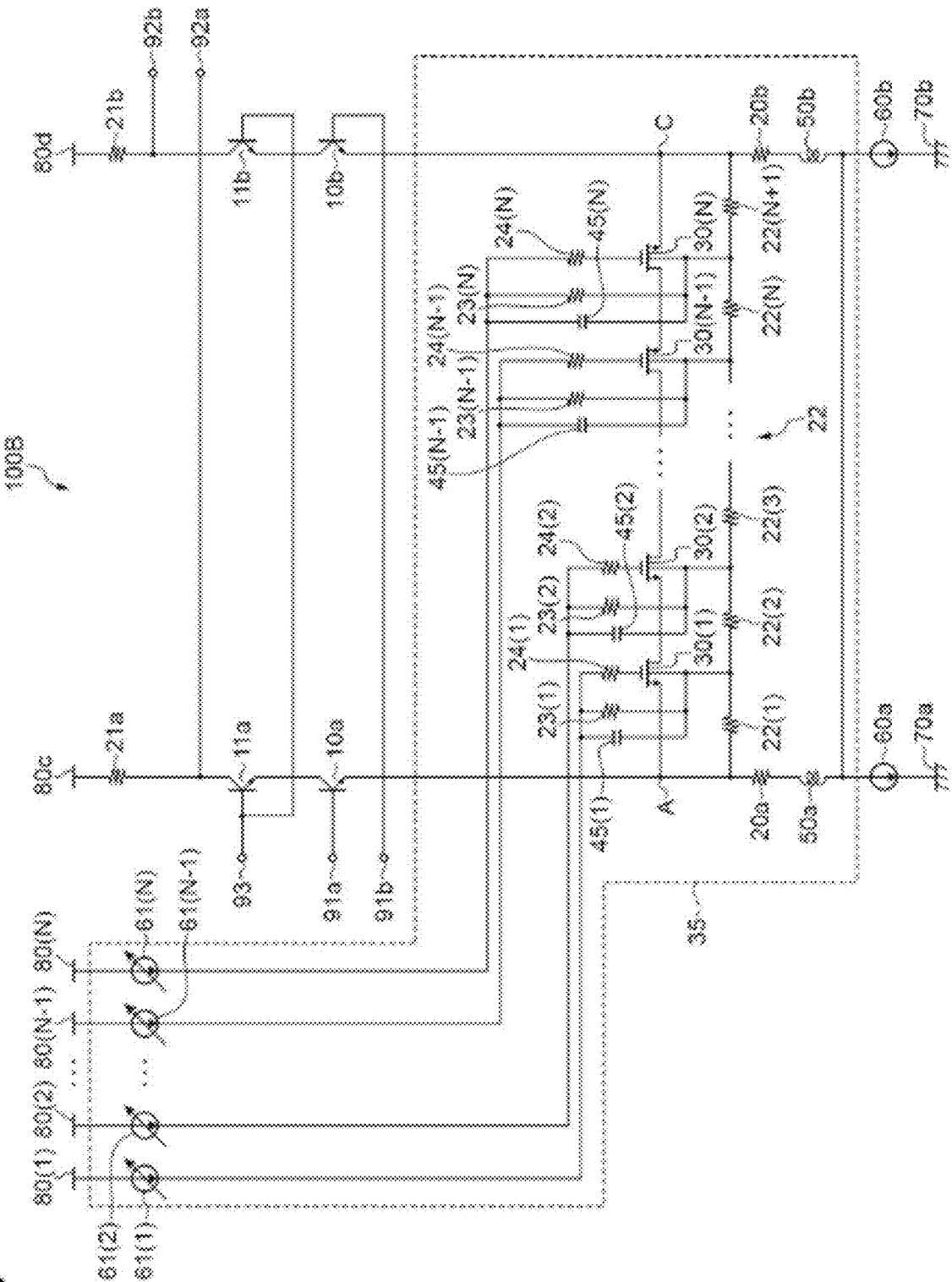
FIG. 11 is a circuit diagram illustrating a constitution of a variable gain amplifier circuit 100B according to another modification example.

FIG. 11 illustrates a constitution of a variable gain amplifier circuit 100B according to another modification example. This variable gain amplifier circuit 100B differs from the variable gain amplifier circuit 100A according to the modification example described above regarding the constitution of the degeneration circuit 35.

That is, two current terminals (source and drain) of first to Nth (N is an integer of 3 or larger) MOS transistors 30(1) to 30(N) are connected in series between the node A and the node C. Specifically, the source of the MOS transistor 30(1) is connected to the node A, the MOS transistor 30(i) (i is an integer of 2 to N−1) and the MOS transistor 30(i−1) are connected in series by the current terminal, and the MOS transistor (N) is connected between the MOS transistor (N−1) and the node C. It is preferable that these MOS transistors 30(1) to 30(N) be the same kind and have the same size, and it is preferable that the gate-source capacitance and the gate-drain capacitance of the MOS transistors 30(1) to 30(N) be approximately equal to each other. In such a constitution, it can be regarded that 2×N capacitors having equal capacitances are connected in series. For this reason, in the higher range, the absolute values of the gate-source voltage and the gate-drain voltage of the MOS transistors 30(1) to 30(N) become |Va|/N. In addition, with m as an integer of 1 to N, the gate voltage of the MOS transistor 30(m) becomes Va−(2m−1)Va/N.

In addition, resistive elements (gate connection resistors) 24(1) to 24(N) are respectively connected to the gates of the MOS transistors 30(1) to 30(N), which are respectively connected to current sources 61(1) to 61(N) generating a variable current through the resistive elements 24(1) to 24(N). These N current sources 61(1) to 61(N) are respectively connected between power lines 80(1) to 81(N) each having the second power potential and the resistive elements 24(1) to 24(N).

Moreover, the series resistor circuit 22 in which first to N+1th resistive elements (dividing resistors) 22(1) to 22(N+1) are connected in series are provided between the node A and the node C. This series resistor circuit 22 divides voltages between the node A and the node C and respectively generates first to Nth setting voltages in the first dividing node (connection point) between the resistive elements 22(1) and 22(2), the second dividing node between the resistive elements 22(2) and 22(3), and so on to the Nth dividing node between the resistive elements 22(N) and 22(N+1). Specifically, in the resistive element 22(1), one end thereof is connected to the node A, and the other end thereof is connected to the first dividing node. In the resistive element 22(j) (j is an integer of 2 to N), one end thereof is connected to the (j−1)th dividing node, and the other end thereof is connected to the jth dividing node. In the resistive element 22(N+1), one end thereof is connected to the Nth dividing node, and the other end thereof is connected to the node C.

In addition, the first dividing node between the resistive elements 22(1) and 22(2), the second dividing node between the resistive elements 22(2) and 22(3), and so on to the Nth dividing node between the resistive elements 22(N) and 22(N+1) are respectively connected to the back gates of the MOS transistors 30(1) to 30(N). Here, it is preferable that the resistance values of the resistive element 22(2) to 22(N) be equal to each other, the resistance values of the resistive elements 22(1) and 22(N+1) be equal to each other, and the resistance values of the resistive element 22(2) to 22(N) be set to approximately twice the resistance values of the resistive elements 22(1) and 22(N+1). In other words, it is preferable that the resistance ratios of the resistive element 22(1) to 22(N+1) be 1:2: . . . :2:1. Accordingly, the back gate voltage of the MOS transistor 30(m) is set to Va−(2m−1)Va/N.

Furthermore, the parallel circuits each including resistive elements (bias resistors) 23(1) to 23(N) and capacitors 45(1) to 45(N) are respectively connected between the first to Nth dividing nodes of the series resistor circuit 22 and gates (output terminals of current source 61(1) to 61(N)) of the MOS transistors 30(1) to 30(N). Due to the presence of these parallel circuits, the gate voltages of the MOS transistor 30(1) to 30(N) become approximately equal to the back gate voltages in the lower range and the middle range, and the gate voltage of the MOS transistor 30(m) is set to Va−(2m−1)Va/N.

According to the variable gain amplifier circuit 100B of such a modification example, the gate voltage of the MOS transistor 30(m) is set to a value determined by Va−(2m−1) Va/N at a broad frequency band. As a result, a variable gain amplifier circuit having excellent linearity in a broad frequency band can be realized.

In the present modification example, when the number of stages N of MOS transistors increases, the gate-source voltage and the gate-drain voltage of the MOS transistors 30(1) to 30(N) decrease. Therefore, increase in THD can be regulated to a low level. On the other hand, in order to make the resistance between the node A and the node C equal to it in the case of N=1, there is a need to make the sizes of the MOS transistors 30(1) to 30(N) be N times. Therefore, the parasitic capacitances in the nodes A and C tend to increase. For this reason, in the present modification example, it is preferable to include the inductors 50a and 50b.

What is claimed is:

1. A variable gain amplifier circuit comprising:
    a first input terminal and a second input terminal;
    a first output terminal and a second output terminal;
    a first transistor having a control terminal, a first current terminal, and a second current terminal, the control terminal being electrically connected to the first input terminal, the first current terminal being electrically connected to the first output terminal;
    a second transistor having a control terminal, a first current terminal, and a second current terminal, the control terminal of the second transistor being electrically connected to the second input terminal, the first current terminal of the second transistor being electrically connected to the second output terminal;
    a current source electrically connected between a first power line and the respective second current terminals of the first transistor and the second transistor;
    a first load element electrically connected between the first output terminal and a second power line;
    a second load element electrically connected between the second output terminal and the second power line; and
    a variable resistance circuit having a first node and a second node, the first node being connected to the second current terminal of the first transistor, the second node being connected to the second current terminal of the second transistor, the variable resistance circuit being configured to vary a resistance value between the first node and the second node,
    wherein the variable resistance circuit includes
        a first field effect transistor having a first control terminal, a first terminal, and a second terminal, the first terminal being connected to the first node,
        a second field effect transistor having a second control terminal, a third terminal, and a fourth terminal, the third terminal being connected to the second node, the fourth terminal being connected to the second terminal of the first field effect transistor,
        a first dividing resistor connected between the first node and a first dividing node,
        a second dividing resistor connected between the first dividing node and a second dividing node,
        a third dividing resistor connected between the second dividing node and the second node,
        a first series resistor,
        a second series resistor,
        a first variable current source connected to the first control terminal of the first field effect transistor via the first series resistor, a second variable current source connected to the second control terminal of the second field effect transistor via the second series resistor, a first bias resistor connected between the first variable current source and the first dividing node, and a second bias resistor connected between the second variable current source and the second dividing node.

2. The variable gain amplifier circuit according to claim 1, wherein the variable resistance circuit further includes a first capacitor connected between the first variable current source and the first dividing node, and a second capacitor connected between the second variable current source and the second dividing node.

3. The variable gain amplifier circuit according to claim 1, wherein a resistance value of the first dividing resistor is equal to a resistance value of the third dividing resistor, and wherein a resistance value of the second dividing resistor is twice the resistance value of the first dividing resistor.

4. The variable gain amplifier circuit according to claim 1, wherein the first dividing node is connected to a back gate of the first field effect transistor, and wherein the second dividing node is connected to a back gate of the second field effect transistor.

5. The variable gain amplifier circuit according to claim 1 further comprising:

a first inductor connected between one end of the current source and the first node; and a second inductor connected between the one end of the current source and the second node.

6. A semiconductor integrated circuit comprising:

the variable gain amplifier circuit according to claim 1.

7. A variable gain amplifier circuit comprising:

a first input terminal and a second input terminal;

a first output terminal and a second output terminal;

a first transistor having a control terminal, a first current terminal, and a second current terminal, the control terminal being electrically connected to the first input terminal, the first current terminal being electrically connected to the first output terminal;

a second transistor having a control terminal, a first current terminal, and a second current terminal, the control terminal of the second transistor being electrically connected to the second input terminal, the first current terminal of the second transistor being electrically connected to the second output terminal;

a current source electrically connected between a first power line and the respective second current terminals of the first transistor and the second transistor;

a first load element electrically connected between the first output terminal and a second power line;

a second load element electrically connected between the second output terminal and the second power line; and a variable resistance circuit having a first node and a second node, the first node being connected to the second current terminal of the first transistor, the second node being connected to the second current terminal of the second transistor, the variable resistance circuit being configured to vary a resistance value between the first node and the second node, wherein the variable resistance circuit includes N (N is an integer of 3 or larger) field effect transistors including a first field effect transistor to an Nth field effect transistor each having two terminals and a control terminal and having the two terminals connected in series between the first node and the second node, the first field effect transistor being connected to the first node, an ith (i is an integer of 2 to N−1) field effect transistor being connected to an i−1th field effect transistor, the Nth field effect transistor being connected between an N−1th field effect transistor and the second node, N+1 dividing resistors including a first dividing resistor to an N+1th dividing resistor connected in series between the first node and the second node, the first dividing resistor being connected between the first node and a first dividing node, a jth (j is an integer of 2 to N) dividing resistor being connected between a j−1th dividing node and a jth dividing node, the N+1th dividing resistor being connected between an Nth dividing node and the second node, N variable current sources including a first variable current source to an Nth variable current source each providing a variable current, N series resistors including a first series resistor to an Nth series resistor, a kth (k is an integer of 1 to N) series resistor being connected between a kth variable current source and the control terminal of a kth field effect transistor, and N bias resistors including a first bias resistor to an Nth bias resistor, an mth (m is an integer of 1 to N) bias resistor being connected between an mth dividing node and an mth variable current source.

8. The variable gain amplifier circuit according to claim 7, wherein the variable resistance circuit further includes N capacitors including a first capacitor to an Nth capacitor, with an nth (n is an integer of 1 to N) capacitor being connected between an nth dividing node and an nth variable current source.

9. The variable gain amplifier circuit according to claim 7, wherein a resistance value of the first dividing resistor is equal to a resistance value of the N+1th dividing resistor, and wherein a resistance value of each of the second dividing resistor to an Nth dividing resistor is twice the resistance value of the first dividing resistor.

10. The variable gain amplifier circuit according to claim 7, wherein in N dividing nodes including the first dividing node to the Nth dividing node, a pth (p is an integer of 1 to N) dividing node is connected to a back gate of a pth field effect transistor.

11. The variable gain amplifier circuit according to claim 7 further comprising:

a first inductor connected between one end of the current source and the first node; and a second inductor connected between the one end of the current source and the second node.

12. A semiconductor integrated circuit comprising:

the variable gain amplifier circuit according to claim 7.

* * * * *